United States Patent
Chang et al.

(10) Patent No.: US 7,446,050 B2
(45) Date of Patent: Nov. 4, 2008

(54) ETCHING AND PLASMA TREATMENT PROCESS TO IMPROVE A GATE PROFILE

(75) Inventors: M. C. Chang, Taipei (TW); L. T. Lin, Hsin-chu (TW); Y. I. Wang, Taichung (TW); Y. H. Chiu, Taipei (TW); H. J. Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 539 days.

(21) Appl. No.: 10/634,001

(22) Filed: Aug. 4, 2003

(65) Prior Publication Data

US 2005/0032386 A1    Feb. 10, 2005

(51) Int. Cl.
*H01L 21/302* (2006.01)

(52) U.S. Cl. ............ 438/712; 438/714; 438/710; 438/585; 438/734; 438/627; 216/67

(58) Field of Classification Search ........... 438/712
See application file for complete search history.

(56) References Cited

U.S. PATENT DOCUMENTS

| | | | | |
|---|---|---|---|---|
| 5,242,536 A * | 9/1993 | Schoenborn | ............ | 438/714 |
| 5,665,203 A * | 9/1997 | Lee et al. | ............ | 438/585 |
| 5,679,606 A * | 10/1997 | Wang et al. | ............ | 438/763 |
| 6,081,334 A * | 6/2000 | Grimbergen et al. | ........ | 356/499 |
| 6,093,332 A * | 7/2000 | Winniczek et al. | ............ | 216/2 |
| 6,127,278 A * | 10/2000 | Wang et al. | ............ | 438/719 |
| 6,143,625 A * | 11/2000 | Chen et al. | ............ | 438/435 |
| 6,184,158 B1 * | 2/2001 | Shufflebotham et al. | .... | 438/788 |
| 6,194,323 B1 * | 2/2001 | Downey et al. | ............ | 438/717 |
| 6,251,792 B1 * | 6/2001 | Collins et al. | ............ | 438/710 |
| 6,284,665 B1 * | 9/2001 | Lill et al. | ............ | 438/710 |
| 6,372,654 B1 * | 4/2002 | Tokashiki | ............ | 438/712 |
| 6,440,756 B2 * | 8/2002 | Shohet et al. | ............ | 438/4 |
| 6,566,264 B1 * | 5/2003 | Cave et al. | ............ | 438/689 |
| 6,620,575 B2 * | 9/2003 | Kim et al. | ............ | 430/314 |
| 6,620,713 B2 * | 9/2003 | Arghavani et al. | ............ | 438/585 |
| 6,656,832 B1 * | 12/2003 | Pan et al. | ............ | 438/627 |
| 6,759,337 B1 * | 7/2004 | Aronowitz et al. | ............ | 438/706 |
| 6,902,681 B2 * | 6/2005 | Nallan et al. | ............ | 216/67 |
| 2003/0003748 A1 * | 1/2003 | Khan et al. | ............ | 438/694 |

OTHER PUBLICATIONS

The Handbook of Plasma Procesing Technology—Fu8ndamentals, Etching, Deposition, and Surface Interactions, edited by Rossnagel, p. 198, 1990.*

(Continued)

*Primary Examiner*—Keith D. Hendricks
*Assistant Examiner*—Patricia A. George
(74) *Attorney, Agent, or Firm*—Tung & Associates

(57) ABSTRACT

A method for improving a polysilicon gate electrode profile to avoid preferential RIE etching in a polysilicon gate electrode etching process including carrying out a multi-step etching process wherein at least one of a lower RF source power and RF bias power are reduced to complete a polysilicon etching process and an in-situ plasma treatment with an inert gas plasma is carried out prior to neutralize an electrical charge imbalance prior to carrying out an overetch step.

23 Claims, 2 Drawing Sheets

OTHER PUBLICATIONS

Westerheim et al. (High-density inductively coupled plasma etch of sub half micron critical layers: Transistor polysilicon gate definition and contact formation; American Vacuum Society Sep./Oct. 1998, pp. 2699-2706; Digital Semiconductor).*

Hwang et al. (Ion mass effect in plasma induced charging, Jun. 1997; AIP).*

Wolf et al. (Silicon Processing for the VLSI Era; vol. 1; 1986; Lattice Press).*

* cited by examiner

ETCHING AND PLASMA TREATMENT PROCESS TO IMPROVE A GATE PROFILE

FIELD OF THE INVENTION

This invention generally relates to plasma enhanced etching including reactive ion etching (RIE) of gate electrodes in microelectronic and nanoelectronic integrated circuit manufacturing and more particularly to an RIE method including an inert gas plasma treatment to improve a gate electrode etching profile.

BACKGROUND OF THE INVENTION

As devices become smaller and integration density increases, reactive ion etching (RIE) has become a key process in anisotropic etching of semiconductor features. RIE or ion-enhanced etching works by a combination of physical and chemical mechanisms for achieving selectivity and anisotropicity during the etching process. Generally, plasma assisted anisotropic etching operates in the milliTorr range and above. Generally, three processes compete with each other during plasma etching; physical bombardment by ions, chemical etching by radicals and ions, and surface passivation by the deposition of passivating films. In some applications, for example, etching high aspect ratio features, high density plasma (HDP) etching having a higher density of ions and operating at lower pressures has been increasingly used in etching high aspect ratio features, for example, having aspect ratios greater than about 3:1.

An increasingly problematical phenomenon in RIE process is the accumulation of localized electrical charge imbalances over the wafer surface during etching. For example, when localized charge imbalances accumulate, the localized electric field created can be either positive or negative depending on the steady state relationship between electron/hole pair creation and recombination which depends on local variations in the material being etched and the energy, charge, and flux of impacting plasma ions and radicals. In addition, the nature of localized charge imbalances forming on the process wafer surface during RIE etching are influenced by the various RIE process parameters such as RF source power and RF bias power. For example, depending on the Fermi level of a semiconducting material and the band gap of an insulating material localized negative charge imbalances forming on target etching surfaces may create a relatively attractive or repulsive effect on impacting plasma ions and radicals. For example, the effect may be exacerbated in an RIE etching process when a conductive or semi-conductive material is adjacent an insulating material where charge accumulation more readily occurs at a material interface due to a local imbalance in the steady state creation and recombination of electron/hole pairs. Such localized charge imbalance accumulations can adversely impact RIE etching process causing undesirable preferential etching in targeted etching areas.

One semiconductor device structure where etching profiles can critically affect the electrical operation of the structure includes the etching of gate electrodes. In many integrated circuits, both NMOS and PMOS gate electrode structures are formed in parallel in a single RIE etching process. A recurring problem is the inconsistency of the etching profiles obtained for parallel formation of NMOS and PMOS polysilicon gate electrodes. One particular problem involves the formation of a 'foot' (increase in the gate electrode width) and/or a 'notch' (decrease in the gate electrode width) at the base of the polysilicon electrode depending on the dopant type of the polysilicon gate. In addition, damage to the underlying gate dielectric can occur. Etching profile defects including feet or notches adversely affect the electrical properties of NMOS and PMOS gates and gate electrodes including decreased dielectric breakdown strength, Voltage threshold variations, and current leakage.

There is therefore a need in the semiconductor processing art to develop an improved method for etching gate electrodes to achieve improved etching profiles while avoiding the formation of preferential etching defects thereby improving device reliability and process wafer yield.

It is therefore an object of the invention to provide an improved method for etching gate electrodes to achieve improved etching profiles while avoiding the formation of preferential etching defects thereby improving device reliability and process wafer yield while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for improving a polysilicon gate electrode profile to avoid preferential RIE etching in a polysilicon gate electrode etching process.

In a first embodiment, the method includes providing a semiconductor process wafer comprising a gate dielectric formed over a silicon substrate and a polysilicon layer formed over the gate dielectric; providing a hardmask layer over the polysilicon layer; patterning the hardmask layer for forming a gate electrode according to a photolithographic patterning process; carrying out a first reaction ion etch (RIE) step to etch through a thickness of the hardmask layer to expose the polysilicon layer; carrying out a second RIE step to etch through a first thickness portion of the polysilicon layer including an RF source power and an RF bias power; carrying out a third RIE step to etch through a second thickness portion of the polysilicon layer including at least one of a lower RF source power and RF bias power compared to the second RIE step; plasma treating the exposed gate dielectric and polysilicon layer in-situ wherein the plasma is formed essentially from an inert source gas to neutralize an electrical charge imbalance; and, carrying out a fourth RIE etch process to etch through a remaining thickness of the polysilicon layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a particular NMOS and PMOS device, it will be appreciate that the method of the present invention may be applied to the formation of any MOSFET device including the formation of a polysilicon gate electrode according to an RIE etching process where an etching profile of the polysilicon gate electrode may be advantageously improved to avoid preferential etching defects. For example, the formation of split gate MOSFETS, twin gate MOSFETS and dual gate SOI devices are contemplated by the method of the present invention.

Figure 1A:
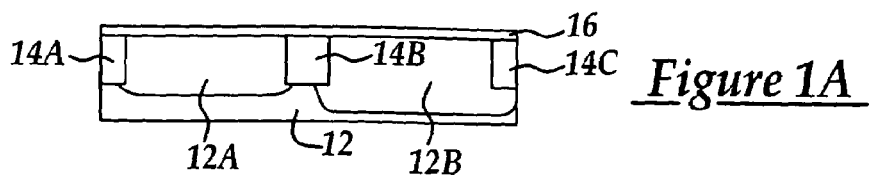
FIGS. 1A-1G are cross sectional schematic representations of an exemplary portion of a CMOS device including NMOS and PMOS portions formed in parallel at stages of manufacture according to an embodiment of the present invention.

Referring to FIGS. 1A-1G in an exemplary embodiment of the method of the present invention, are shown cross-sectional schematic views of a portion of a semiconductor wafer during stages in production of CMOS structures including NMOS and PMOS devices. For example, referring to FIG. 1A is shown a silicon substrate 12 including n-doped well region 12A and p-doped well region 12B formed by conventional methods, for example depositing silicon nitride masks followed by ion implantation. Shallow trench isolation (STI) structures e.g., 14A, 14B, and 14C are formed by conventional etching and STI oxide backfilling processes. For example, the STI structures are formed for example, by deposition of a nitride layer followed by STI trench formation, CVD oxide deposition, planarization, and finally nitride stripping. Following formation of the STI structures, the well regions are formed by growing a layer of sacrificial oxide followed by deposition and patterning of photoresist implant masks over respective well regions to carryout a high energy (e.g., 500 KeV to 1 MeV) ion implants, Voltage threshold adjustment implants, and a punch-through implants over the respective well regions. For example, a boron implant for forming the p-well region 12B and a phosphorous implant for forming the n-well region 12A are used as is known in the art. An RTP anneal at about 850° C. to 950° C. is then carried out to activate the well regions.

Still referring to FIG. 1A, following the well region formation process, the sacrificial oxide is stripped, the wafer cleaned by conventional processes and a gate dielectric layer 16 is formed. It will be appreciated that a thermally grown $SiO_2$ layer may be used as the gate dielectric layer 16 or may be formed of one or more high-K dielectric layers having a dielectric constant greater than about 10, more preferably greater than about 20, for example including binary oxides such as lanthanum oxides, for example hafnium oxide (e.g., $HfO_2$) grown by an ALCVD process over an ultra-thin interfacial oxide layer. Where a thermally grown oxide layer is used as the gate dielectric layer 16, the gate oxide layer is formed to a thickness of about 20 Angstroms to about 60 Angstroms, for example grown at a temperature of from about 850° C. to about 1050° C. using either a furnace or an RTP anneal. The gate oxide layer 16 is then optionally subjected to a nitridation process to prevent subsequent boron penetration.

Figure 1B:
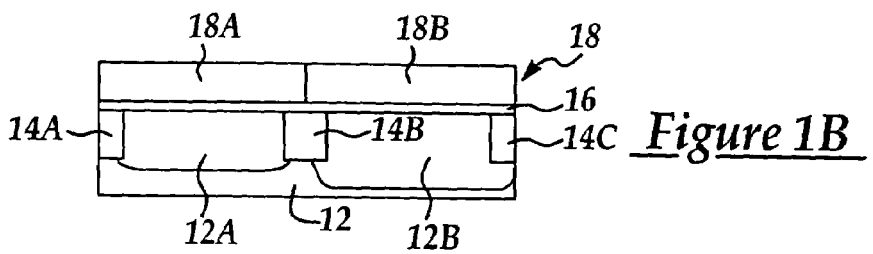

Referring to FIG. 1B, a polysilicon layer 18 is then deposited to a thickness of about 1500 Angstroms to about 3000 Angstroms over the gate dielectric layer 16. In one embodiment, an n-doped region 18A is formed in the polysilicon layer 18 overlying the p-well region 12A in silicon wafer 10 adjacent to a p-doped region 18B overlying the n-well region 12C. The n-doped and p-doped regions are formed by conventional masking and ion implantation methods, for example using photoresist masks to selectively implant the n-doped region with for example, phosphorous and the p-doped region with boron to predetermined concentrations as are known in the art, for example greater than about $10^{19}$ dopant atoms/cm$^3$.

Figure 1C:
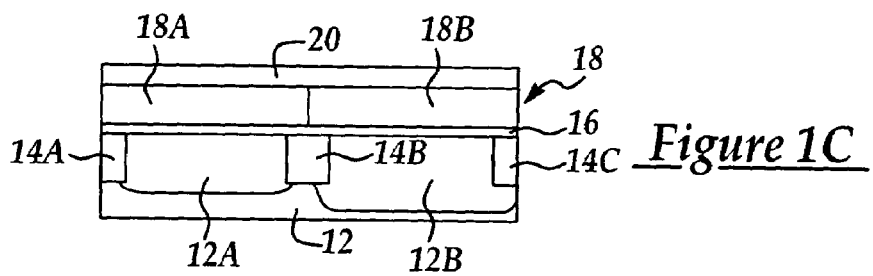

Referring to FIG. 1C, a hardmask layer 20 is deposited over the polysilicon layer 16 to a thickness of about 200 Angstroms to about 400 Angstroms. The hardmask layer 20 is preferably formed of one of silicon dioxide, for example grown by a wet or dry thermal process, silicon nitride and silicon oxynitride, deposited by a PECVD or LPCVD process.

According to an embodiment of the invention, in a multi-step RIE etching process, preferably a high density plasma formed by a transformer coupled plasma (TCP) source or inductively coupled plasma (ICP) source, also referred to as a dual source plasma (DSP), is used for the multi-step RIE etching process since the RF bias power is advantageously decoupled from the RF source power to allow an adjustably delivered RF bias power according to preferred embodiments of the present invention. Preferably, the RF bias power, if any is supplied, is supplied at a frequency of greater than about 1 MHz in preferred embodiments.

Figure 1D:
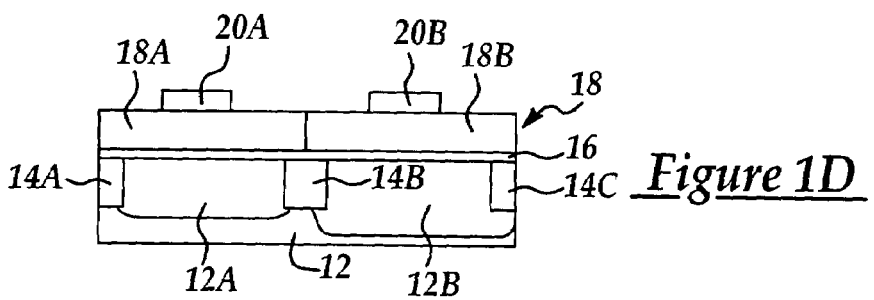

Referring to FIG. 1D, following photolithographic patterning (photoresist layer not shown), in a first step of the multi-step RIE etching process, the hardmask layer is etched through a thickness using a $CF_4$ etching chemistry to expose portions of the underlying polysilicon layer 18 leaving hardmask layer portions e.g., 20A and 20B overlying subsequently formed polysilicon gate electrode portions. Exemplary RIE etching parameters include a plasma pressure of about 2 to about 15 milliTorr using $CF_4$ at a flow rate of about 20 to about 120 sccm. The RF source power is preferably supplied between about 100 to about 1000 Watts including a RF bias power at about 10 to about 200 Watts.

Figure 1E:
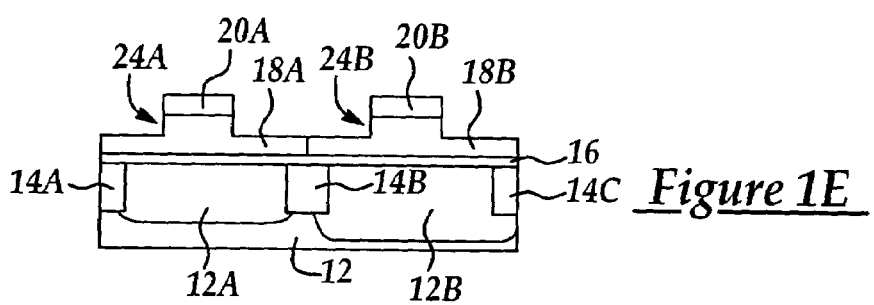

Referring to FIG. 1E, the polysilicon layer 18 including doped portion 18A and 18B is then etched in a first main etching step including a $CF_4/HBr/Cl_2$ etching chemistry through a first thickness portion of the polysilicon layer 18, for example through about ½ to about ¾ of the polysilicon layer 18 thickness to form outlines of polysilicon gate portions e.g., 24A and 24B. Exemplary RIE etch parameters for the main etching step include a plasma pressure of about 2 to about 30 milliTorr using $CF_4$ at a flow rate of about 5 to about 100 sccm, $Cl_2$ at a flow rate of between about 15 and about 150 sccm, HBr at a flow rate of about 20 to about 200 sccm, and helium and oxygen each at a flow rate of about 3 to about 30 sccm. The RF source power is preferably supplied between about 200 to about 500 Watts, including a RF bias power at about 10 to about 200 Watts.

Figure 1F:
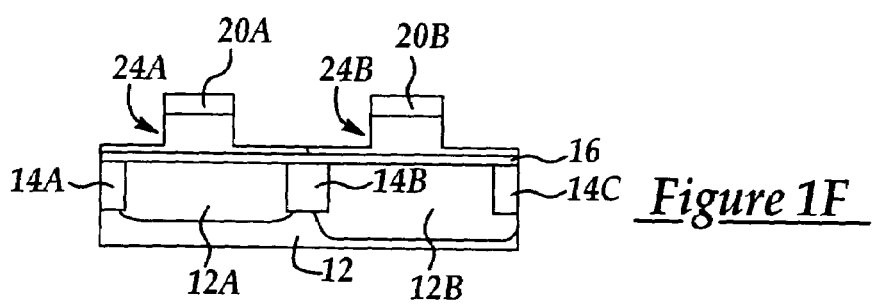

Referring to FIG. 1F, a second main etch step is then carried out where the polysilicon layer 18 is etched through a second thickness portion, for example in one embodiment to endpoint detection of an underlying gate dielectric layer 16 to at least partially expose the underlying gate dielectric layer. In the second main etch step, at least the RF bias power and preferably both the RF bias power and the RF source power are reduced compared to the first main etch step. For example, preferably an RF source power is supplied between about 100 and about 300 Watts and an RF bias power is supplied form about 0 to about 100 Watts. Optionally no (zero) bias power is used. The lower RF source power together with the lower RF bias power, preferably supplied at a frequency of greater than about 1 MHz, reduces ion bombardment energy and reduces electrical charge imbalance buildup at the exposed portions of the polysilicon gates.

In another embodiment, at least one of the first and second main etch processes are carried out using a fluorocarbon/oxygen etching chemistry. Exemplary plasma etching conditions include a plasma pressure of from about 5 to about 100 milliTorr, an RF source power of about 200 to about 1000 Watts, an RF bias power of about 0 to about 100 Watts, and a flow rate of $CF_4$ and $O_2$ each from about 20 to about 200 sccm. If a fluorocarbon/oxygen etching chemistry is used for both the first and second main etch steps at least the RF bias power and preferably both the RF bias power and the RF source power are reduced compared to the first main etch step, including using a zero RF bias power in the second main etch step.

Following the second main etch step carried out using at least one of a lower RF source power and RF bias power compared to the first main etch step, an in-situ plasma treatment with one or more inert source gases such as argon, helium, and nitrogen, including mixtures thereof, is carried out for a period of time, for example from about 15 seconds to about 45 seconds with zero RF bias power supplied and with an RF source power of about 50 Watts to about 150 Watts at a pressure of about 2 milliTorr to about 100 milliTorr. It has been found that the inert plasma treatment according to preferred embodiments has the effect of preventing preferential etching in a subsequent overetch process, for example preventing the formation of notches in a p-doped polysilicon gate.

While not being bound by a particular theory or mechanism, it is believed that the inert plasma treatment following the second main etch process and prior to an overetch process acts to neutralize electrical charge imbalance created by the first and second main etching steps including where a polysilicon/oxide interface is exposed. In particular, it has been found that during an overetch process preferential etching causes foot portions in the n-doped polysilicon gate electrodes and notches in the p-doped polysilicon gate electrodes to be formed. According to an aspect of the present invention it has been found that such preferential etching is advantageously prevented by the inert plasma treatment according to preferred embodiments. In particular, notching of the p-doped polysilicon gate is advantageously prevented by the inert gas plasma treatment after optimizing the RIE etching process for etching a foot free n-doped polysilicon gate.

It is believed that a localized electrical charge imbalance caused by ion bombardment and electron/hole pair creation at the p-doped polysilicon/gate dielectric interface leads to preferential etching by creating an electric field attracting etching gas ions. The inert gas plasma treatment is believed to supply an electrical charge removal path, for example as an electron acceptor or hole donor, thereby removing the charge imbalance while avoiding additional charge buildup and damage to the gate plasma treatment with zero RF bias power supplied. The inert gas plasma treatment has been found to improve the overetch process to avoid preferential etching, for example to form notches in the p-doped polysilicon gates.

Figure 1G:
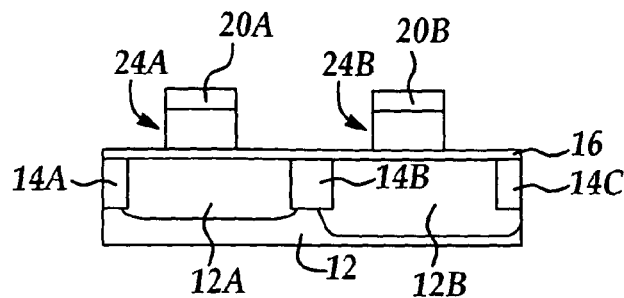

Referring to FIG. 1G, following the inert gas plasma treatment, an overetch process is carried out to remove remaining portions of the polysilicon layer 18 over the gate dielectric layer 16 including removing polysilicon stringers. In one embodiment, the overetch process is carried out under the same plasma conditions as the second main etching process with no RF bias power applied. Etching with no RF bias power prevents the re-accumulation of charge imbalances at the lower portion of the polysilicon gate during the overetch process. Further, damage to the exposed gate dielectric layer by excessively energetic ion bombardment is advantageously avoided. In another embodiment, the overetch process is carried out with a chlorine-free etching chemistry. A chlorine-free etching chemistry, for example a fluorocarbon/oxygen or HBr/oxygen etching chemistry is preferred in the overetching process. For example, the rate of chlorine etching has been found to be influenced by polysilicon doping, thus resulting in variable etching rates for the n-doped and p-doped polysilicon gates, contributing to the formation of preferential etching of the polysilicon gates. Exemplary RIE etching conditions for the overetch process include a plasma pressure of about 10 to about 100 milliTorr, an RF source power of about 200 to about 1000 Watts, no (zero) RF bias power applied and an HBr flow rate of about 20 to about 200 sccm including an inert gas such as helium or argon, and oxygen each at about 2 to about 15 sccm.

Following the polysilicon gate etching process, conventional steps are carried out to complete the formation of the CMOS structures, for example, including removal of a remaining portions of the hardmask layer, ion implants to form halo or LDD implants, spacer formation along the gate electrode sidewalls, ion implants to form the source and drain regions, and optionally, salicide formation to improve a contact resistance.

Figure 2:
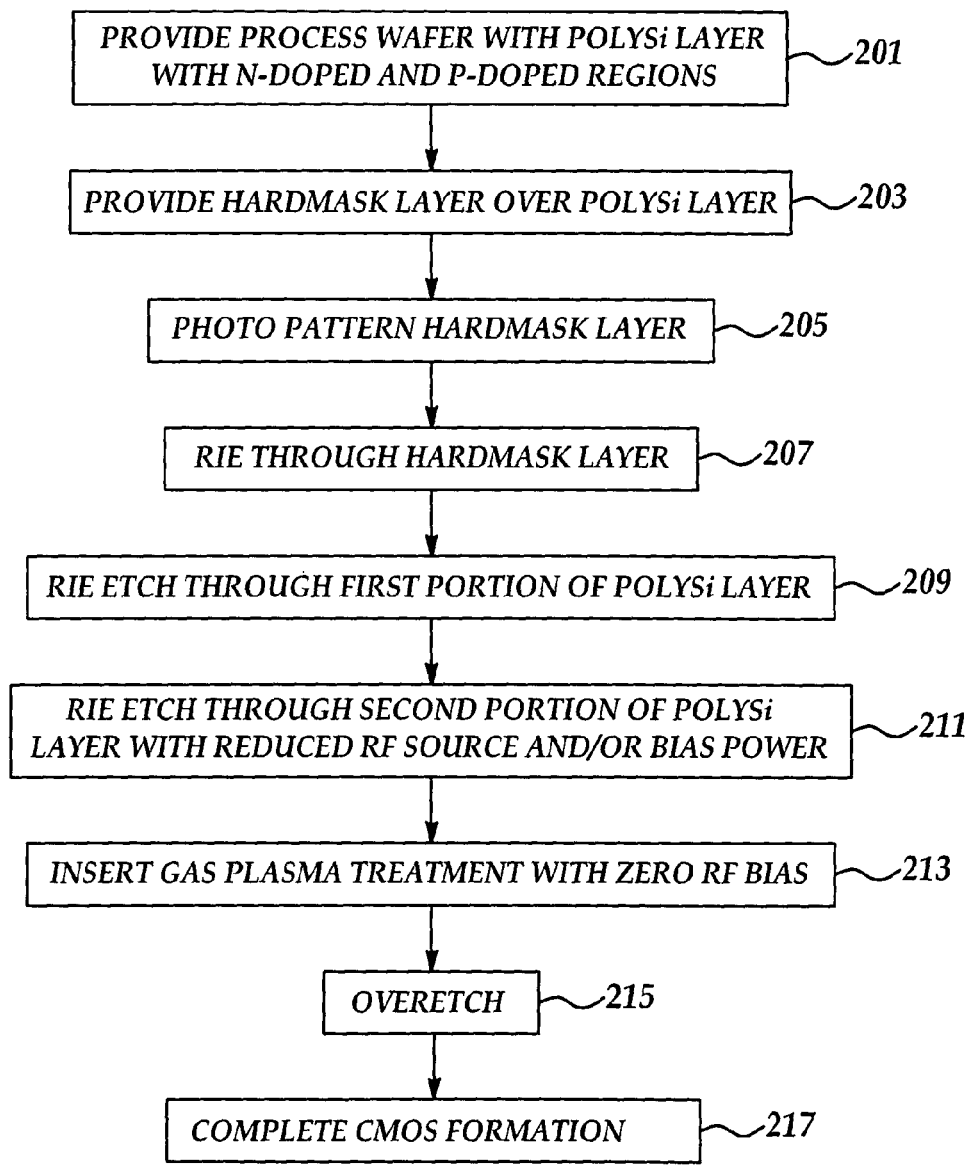
FIG. 2 is an exemplary process flow diagram including several embodiments of the present invention.

Referring to FIG. 2 is a process flow diagram including several embodiments of the present invention. In process 201 a polysilicon layer having an n-doped region and a p-doped region overlying a gate dielectric layer is provided. In process 203, a hardmask layer is provided overlying and contacting the polysilicon layer. In process 205, the hardmask layer is photolithographically patterned for RIE etching polysilicon gate electrodes. In process 207, a breakthrough RIE etch is carried out to etch through a thickness of the hardmask layer and expose portions of the polysilicon layer. In process 209 a first main RIE etch is carried out to etch through a first thickness portion of the polysilicon layer. In process 211, a second main RIE etch is carried out etch through a second thickness portion of the polysilicon layer using at least one of a lower RF source power and an RF bias power compared to the first main RIE etch. In process 213 an inert gas plasma treatment using zero RF bias is carried out to electrically neutralize localized charge imbalances on the polysilicon gate electrode. In process 215, an overetch process is carried out. In process 217, conventional processes are carried out to complete the formation of the CMOS device.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for improving a polysilicon gate electrode profile to avoid preferential RIE etching including notching in a polysilicon gate electrode etching process comprising the steps of:
   providing a semiconductor process water comprising a gate dielectric formed over a silicon substrate and a polysilicon layer formed over the gate dielectric;
   providing a hardmask layer over the polysilicon layer;
   carrying out a first reactive ion etch (RIE) step to etch through a thickness of the hardmask layer to expose the polysilicon layer to form a patterned hard mask for forming a gate electrode;
   carrying out a second RIE step to etch through a first thickness portion of the polysilicon layer including an RF source power and an RF bias power;
   carrying out a third RIE step to etch through a second thickness portion of the polysilicon layer to endpoint detection to expose portions of an underlying gate dielectric including using lower RF power compared to the second RIE step, said lover RF power selected from the group consisting of a lower RF source power and a lower RF bias power; and,
   then plasma treating the exposed gate dielectric and polysilicon layer in-situ with a plasma consisting of inert gas to neutralize an electrical charge imbalance.

2. The method of claim 1, wherein the step of plasma treating is carried out without RF bias power.

3. The method of claim 1, further comprising an RIE overetch step carried out without RF bias power.

4. The method of claim 1, wherein the polysilicon layer includes an n-dope region and a p-doped region for forming respectively doped polysilicon gate electrodes in parallel.

5. The method of claim 1, wherein the RF source power and RF bias power are reduced in the third RIE Step.

6. The method of claim 1, wherein the inert gas is selected from the group consisting of argon, helium, nitrogen, and mixtures thereof.

7. The method of claim 1, further comprising an RIE overetch step carried out with a chlorine-free etching chemistry.

8. The method of claim 7, wherein the chlorine-free etching chemistry comprises HBr and oxygen.

9. The method of claim 1, wherein the second and third RIE etch steps have an etching chemistry comprising constituents selected from the group consisting of $HBr/Cl_2/O_2$ and $CF_4/Cl_2/O_2$.

10. The method of claim 1, wherein the RF bias power is supplied at a frequency of greater than about 1 MHz adjustably decoupled from the RF source power.

11. The method of claim 1, wherein the gate dielectric is selected from the group consisting of thermally grown $SiO_2$ and binary oxides having a dielectric constant of greater than about 20.

12. The method of claim 1, wherein the hardmask layer is selected from the group consisting of silicon oxide, silicon nitride, and silicon oxynitride.

13. The method of claim 1, wherein the third RIE etch step is carried out without RF bias power.

14. A method for improving a polysilicon gate electrode profile to avoid preferential RIE etching including notching in parallel etching of n and p-doped polysilicon gate electrodes comprising the steps of:
    providing a semiconductor process wafer comprising a gate dielectric formed over a silicon substrate and a polysilicon layer including n-doped and p-doped regions formed over the gate dielectric;
    providing a hardmask layer over the polysilicon layer;
    carrying out a first reaction ion etch (RIE) step to etch through a thickness of the hardmask layer to expose portions of the polysilicon layer to thereby form a patterned hard mask for forming gate electrode;
    carrying out a second RIE step to etch through a first thickness portion of the polysilicon layer including an RF source power and an RF bias power.
    carrying out a third RIE step to etch through a second thickness portion of the polysilicon layer to endpoint detection to expose portions of an underlying gate dielectric using lower RF power compared to the second RIE step, said lower RF power selected from the group consisting of a lower RF source power and a lower RF bias power;
    then plasma treating in-situ with an inert gas plasma consisting of inert gas the exposed gate dielectric and polysilicon layer without RF bias power to neutralize an electrical charge imbalance; and,
    then carrying out an RIE overetch process to remove a remaining portion of the polysilicon layer without RF bias power.

15. The method of claim 14, wherein the RF source power and RF bias power are reduced in the third RIE Step.

16. The method of claim 14, wherein the inert gas is selected from the group consisting of argon, helium, nitrogen, and mixtures thereof.

17. The method of claim 14, wherein the RIE overetch is carried out with a chlorine-free etching chemistry.

18. The method of claim 17, wherein the chlorine-free etching chemistry comprises HBr and oxygen.

19. The method of claim 14, wherein the second and third RIE etch steps have an etching chemistry selected from the group consisting of HBr, $Cl_2$, $CF_4$, and $O_2$.

20. The method of claim 14, wherein the RF bias power is supplied at a frequency of greater than about 1 MHz adjustably decoupled from the RF source power.

21. The method of claim 14, wherein the gate dielectric is selected from the group consisting of thermally grown $SiO_2$ and binary lanthanum oxides having a dielectric constant of greater than about 20.

22. The method of claim 14, wherein the hardmask layer is selected from the group consisting of silicon oxide, silicon nitride, and silicon oxynitride.

23. The method of claim 14, wherein the third RIE etch step is carried out without RF bias power.

* * * * *